(12) United States Patent
Yoshioka et al.

(10) Patent No.: US 9,082,691 B2
(45) Date of Patent: Jul. 14, 2015

(54) NITRIDE SEMICONDUCTOR DEVICE

(75) Inventors: Akira Yoshioka, Kanagawa-ken (JP); Yasunobu Saito, Tokyo (JP); Hidetoshi Fujimoto, Kanagawa-ken (JP); Tetsuya Ohno, Kanagawa-ken (JP); Wataru Saito, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/619,560

(22) Filed: Sep. 14, 2012

(65) Prior Publication Data

US 2013/0069117 A1   Mar. 21, 2013

(30) Foreign Application Priority Data

Sep. 21, 2011   (JP) ................... 2011-206340

(51) Int. Cl.
*H01L 29/66* (2006.01)
*H01L 29/20* (2006.01)
(Continued)

(52) U.S. Cl.
CPC ...... *H01L 29/2003* (2013.01); *H01L 29/42364* (2013.01); *H01L 29/7787* (2013.01)

(58) Field of Classification Search
CPC .................................................. H01L 29/778
USPC .......... 257/192, 194, 195, 471; 438/105, 172
See application file for complete search history.

(56) References Cited

U.S. PATENT DOCUMENTS 7,075,125 B2    7/2006  Saito et al.
7,375,407 B2 *  5/2008  Yanagihara et al. .......... 257/471
(Continued)

FOREIGN PATENT DOCUMENTS

JP    2007273795 A    10/2007
JP    2008198735 A     8/2008
JP    2008277598 A    11/2008

OTHER PUBLICATIONS

Japanese Office Action dated Dec. 25, 2013, filed in Japanese counterpart Application No. 2011-206340, 4 pages (with translation).

*Primary Examiner* — Shaun Campbell
*Assistant Examiner* — Ismail Muse
(74) *Attorney, Agent, or Firm* — Patterson & Sheridan, LLP

(57) ABSTRACT

A nitride semiconductor device includes a substrate, a first $In_{x1}Ga_{1-x1-y1}Al_{y1}N$ layer, a second $In_{x2}Ga_{1-x2-y2}Al_{y2}N$ layer, an interlayer insulating film, a source electrode, a drain electrode, a first gate electrode, a Schottky electrode, a second gate electrode, an interconnection layer. The second $In_{x2}Ga_{1-x2-y2}Al_{y2}N$ layer is provided on a surface of the first $In_{x1}Ga_{1-x1-y1}Al_{y1}N$ layer. The second $In_{x2}Ga_{1-x2-y2}Al_{y2}N$ layer has a wider band gap than the first $In_{x1}Ga_{1-x1-y1}Al_{y1}N$ layer. The first gate electrode is provided between the source electrode and the drain electrode on a surface of the second $In_{x2}Ga_{1-x2-y2}Al_{y2}N$ layer. The Schottky electrode is provided on the second $In_{x2}Ga_{1-x2-y2}Al_{y2}N$ layer between the first gate electrode and the drain electrode. The second gate electrode is provided on the second $In_{x2}Ga_{1-x2-y2}Al_{y2}N$ layer between the Schottky electrode and the drain electrode. The interconnection layer electrically connects the source electrode, the Schottky electrode, and the second gate electrode.

20 Claims, 4 Drawing Sheets

(51) Int. Cl.
*H01L 29/423* (2006.01)
*H01L 29/778* (2006.01)

(56) References Cited

U.S. PATENT DOCUMENTS

| | | | | |
|---|---|---|---|---|
| 7,488,992 | B2* | 2/2009 | Robinson | 257/130 |
| 7,626,218 | B2* | 12/2009 | Hwang et al. | 257/195 |
| 7,759,760 | B2* | 7/2010 | Yafune et al. | 257/471 |
| 2005/0205892 | A1* | 9/2005 | Yanagihara et al. | 257/184 |
| 2007/0102727 | A1* | 5/2007 | Twynam | 257/194 |
| 2007/0241368 | A1* | 10/2007 | Mil'shtein et al. | 257/192 |
| 2008/0006898 | A1* | 1/2008 | Yafune et al. | 257/471 |
| 2010/0155780 | A1* | 6/2010 | Machida et al. | 257/192 |
| 2010/0155781 | A1* | 6/2010 | Suzuki et al. | 257/195 |
| 2011/0012680 | A1* | 1/2011 | Kaido et al. | 330/277 |
| 2011/0133205 | A1* | 6/2011 | Nagahisa et al. | 257/76 |
| 2011/0297961 | A1* | 12/2011 | Bunin et al. | 257/76 |
| 2014/0021511 | A1* | 1/2014 | Jeon et al. | 257/194 |

* cited by examiner

NITRIDE SEMICONDUCTOR DEVICE

CROSS-REFERENCE TO RELATED APPLICATION

This application is based upon and claims the benefit of priority from the prior Japanese Patent Application No. 2011-206340, filed on Sep. 21, 2011; the entire contents of which are incorporated herein by reference.

FIELD

Embodiments described herein relate generally to a nitride semiconductor device including a freewheel diode connected in antiparallel.

BACKGROUND

Nitride semiconductor devices typified by HFETs (heterostructure field effect transistors) formed of a nitride semiconductor are used as semiconductor devices for electric power used for switching power sources, inverter circuits, etc., and are expected to have a higher breakdown voltage and lower ON resistance than semiconductor devices for electric power formed of silicon. When an inductance is included among the loads, it is necessary to allow the current flowing through the inductance to continue to flow as a circulating current when the nitride semiconductor device has become OFF. Hence, the nitride semiconductor device needs to be connected in antiparallel to a freewheel diode. To downsize switching power sources and inverter circuits, it is desired for the nitride semiconductor device to include a freewheel diode connected in antiparallel. A normally off type is desired for the nitride semiconductor device, but in a normally off nitride semiconductor device, resistance is high in a portion immediately below a gate electrode of an electron transit layer through which an operating current flows. For the normally off nitride semiconductor device including a freewheel diode connected in antiparallel, it is desired to have a high breakdown voltage, low ON resistance, and low forward voltage of the freewheel diode.

DETAILED DESCRIPTION

Figure 1:
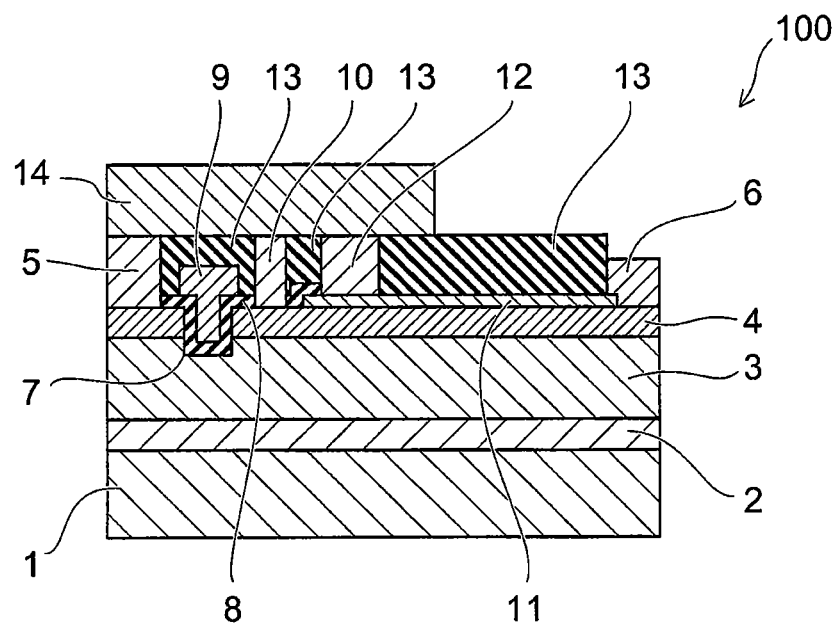
FIG. 1 is a schematic cross-sectional view of a main portion of a nitride semiconductor device according to a first embodiment.

A nitride semiconductor device includes a substrate, a first $In_{x1}Ga_{1-x1-y1}Al_{y1}N$ ($0 \leq x1 \leq 1$, $0 \leq y1 \leq 1$) layer, a second $In_{x2}Ga_{1-x2-y2}Al_{y2}N$ ($0 \leq x2 \leq 1$, $0 \leq y2 \leq 1$) layer, an interlayer insulating film, a source electrode, a drain electrode, a first gate electrode, a Schottky electrode, a second gate electrode, an interconnection layer. The first $In_{x1}Ga_{1-x1-y1}Al_{y1}N$ layer is provided on the substrate. The second $In_{x2}Ga_{1-x2-y2}Al_{y2}N$ layer is provided on a surface of the first $In_{x1}Ga_{1-x1-y1}Al_{y1}N$ layer on an opposite side to the substrate and configured to form a two-dimensional electron gas at an interface with the first $In_{x1}Ga_{1-x1-y1}Al_{y1}N$ layer. The second $In_{x2}Ga_{1-x2-y2}Al_{y2}N$ layer has a wider band gap than the first $In_{x1}Ga_{1-x1-y1}Al_{y1}N$ layer. The interlayer insulating film is provided on a surface of the second $In_{x2}Ga_{1-x2-y2}Al_{y2}N$ layer on an opposite side to the substrate. The source electrode penetrates through the interlayer insulating film and is provided on a surface of the second $In_{x2}Ga_{1-x2-y2}Al_{y2}N$ layer on an opposite side to the substrate in an electrically connected manner. The drain electrode penetrates through the interlayer insulating film and is provided on the surface of the second $In_{x2}Ga_{1-x2-y2}Al_{y2}N$ layer on an opposite side to the substrate in an electrically connected manner away from the source electrode. The first gate electrode is provided between the source electrode and the drain electrode between the interlayer insulating film and the first $In_{x1}Ga_{1-x1-y1}Al_{y1}N$ layer. The Schottky electrode penetrates through the interlayer insulating film, is provided between the first gate electrode and the drain electrode on an opposite side to the substrate, and is provided on the second $In_{x2}Ga_{1-x2-y2}Al_{y2}N$ layer via a Schottky junction. The second gate electrode is provided on the second $In_{x2}Ga_{1-x2-y2}Al_{y2}N$ layer between the Schottky electrode and the drain electrode. The interconnection layer is provided on the interlayer insulating film, on the source electrode, on the Schottky electrode, and on the second gate electrode and electrically connects the source electrode, the Schottky electrode, and the second gate electrode. The first gate electrode is formed such that a portion opposed to the first gate electrode of the first $In_{x1}Ga_{1-x1-y1}Al_{y1}N$ layer becomes non-conductive when a voltage lower than a first voltage positive with respect to the source electrode is applied to the first gate electrode, and such that the portion opposed to the first gate electrode of the first $In_{x1}Ga_{1-x1-y1}Al_{y1}N$ layer becomes conductive when a voltage higher than the first voltage is applied to the first gate electrode. The second gate electrode is formed such that a portion opposed to the second gate electrode of the first $In_{x1}Ga_{1-x1-y1}Al_{y1}N$ layer becomes non-conductive when a voltage lower than a second voltage negative with respect to the drain electrode is applied to the second gate electrode, and such that the portion opposed to the second gate electrode of the first $In_{x1}Ga_{1-x1-y1}Al_{y1}N$ layer becomes conductive when a voltage higher than the second voltage is applied to the second gate electrode.

Hereinbelow, embodiments of the invention are described with reference to the drawings. The drawings used in the description of the examples are schematic for easier description; and in the actual practice, the configurations, dimensions, magnitude relationships, and the like of the components in the drawings are not necessarily the same as those illustrated in the drawings and may be appropriately altered to the extent that the effect of the invention is obtained.

First Embodiment

Figure 2:
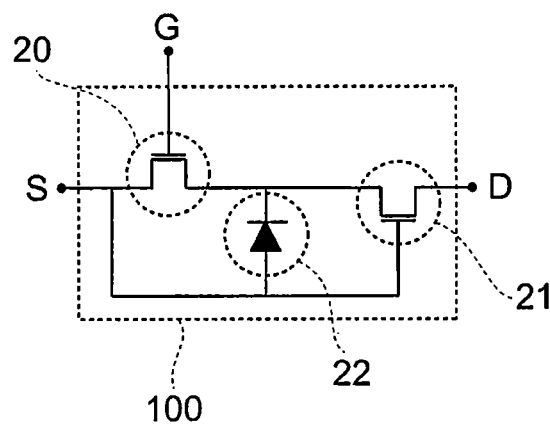
FIG. 2 is an equivalent circuit diagram of the nitride semiconductor device according to the first embodiment.

A nitride semiconductor device according to a first embodiment will now be described using FIG. 1 and FIG. 2. FIG. 1 is a schematic cross-sectional view of a main portion of a reverse conducting HFET 100 according to the embodiment. FIG. 2 is an equivalent circuit diagram of the HFET 100 shown in FIG. 1. As shown in FIG. 1, the HFET 100 according to the embodiment includes a substrate 1, a buffer layer 2, a GaN electron transit layer 3, an AlGaN electron supply layer 4, a source electrode 5, a drain electrode 6, a first gate insulating film 8, a first gate electrode 9, a Schottky electrode 10, a second gate insulating film 11, a second gate electrode 12, an interlayer insulating film 13, and an interconnection layer 14.

The substrate 1 may be, for example, SiC (silicon carbide), or may be $Al_2O_3$ (alumina), Si (silicon), or GaN (gallium nitride). The buffer layer 2 is provided on the substrate, and is formed of, for example, $Al_xGa_{1-x}N$ (0≤x≤1). The Al composition ratio is appropriately selected based on crystal growth conditions and the like. The $Al_xGa_{1-x}N$ layer may be a superlattice structure in which AlN and GaN are alternately stacked.

The GaN electron transit layer 3 is provided on a surface of the buffer layer 2 on the opposite side to the substrate 1. The GaN electron transit layer 3 may be, other than GaN, a nitride semiconductor generally expressed by $In_{x1}Ga_{1-x1-y1}Al_{y1}N$ (0≤x1≤1, 0≤y1≤1) (a first $In_{x1}Ga_{1-x1-y1}Al_{y1}N$ layer). The GaN electron transit layer 3 is formed by crystal growth in an undoped manner, and has a thickness of, for example, 2.0 µm.

The AlGaN electron supply layer 4 is provided on a surface of the GaN electron transit layer 3 on the opposite side to the substrate. The AlGaN electron supply layer 4 is, for example, a layer formed by crystal growth in an undoped manner and having an Al composition ratio (the ratio of the number of moles of Al to the sum of the numbers of moles of Al and Ga) of 25% and a film thickness of 30 nm. The AlGaN electron supply layer 4 may also be a layer formed by crystal growth while being doped with an n-type impurity, instead of undoped. The AlGaN electron supply layer 4 may be a nitride semiconductor expressed by $In_{x2}Ga_{1-x2-y2}Al_{y2}N$ (0≤x2≤1, 0≤y2≤1) (a second $In_{x2}Ga_{1-x2-y2}Al_{y2}N$ layer) having a wider band gap than the GaN electron transit layer 3 (in general, the first $In_{x1}Ga_{1-x1-y1}Al_{y1}N$ layer).

A two-dimensional electron gas is formed at the interface between the AlGaN electron supply layer 4 and the GaN electron transit layer 3 in the GaN electron transit layer 3. The two-dimensional electron gas may be generated by the following reasons. The lattice constant of the AlGaN electron supply layer 4 is larger than the lattice constant of the GaN electron transit layer 3; therefore, the AlGaN electron supply layer 4 provided on the GaN electron transit layer 3 has compressive strain. An electric field is generated in the AlGaN electron supply layer 4 by the piezoelectric effect due to the compressive strain. By the electric field, electrons are accumulated to form a two-dimensional electron gas at the interface between the AlGaN electron supply layer 4 and the GaN electron transit layer 3 in the GaN electron transit layer 3.

The two-dimensional electron gas is formed in the GaN electron supply layer 3 along the interface between the AlGaN electron supply layer 4 and the GaN electron transit layer 3, and functions as a channel layer through which the current of the HFET 100 flows, as described later.

The two-dimensional electron gas may be formed also by an electric field due to polarization (spontaneous polarization) that the AlGaN electron supply layer 4 inherently has. As the AlGaN electron supply layer 4 becomes thicker, the piezoelectric effect and spontaneous polarization increase, and consequently the concentration of electrons of the two-dimensional electron gas increases. That is, the resistance of the channel layer decreases and the ON resistance of the HFET 100 is reduced.

The source electrode 5 is provided on the AlGaN electron supply layer 4 and is electrically connected to the AlGaN electron supply layer 4. The drain electrode 6 is provided on the AlGaN electron supply layer 4 away from the source electrode 5, and is electrically connected to the AlGaN electron supply layer 4. The source electrode 5 and the drain electrode 6 need only to be a metal material capable of making ohmic contact with a nitride semiconductor layer, and Ti (titanium)/Al (aluminum) or the like, for example, is used. Each of the source electrode 5 and the drain electrode 6 may be in direct ohmic contact with the AlGaN electron supply layer 4, or may be electrically connected to the AlGaN layer 4 via another nitride semiconductor layer making ohmic contact.

A recess 7 is formed so as to extend from a surface of the AlGaN electron supply layer 4 on the opposite side to the substrate 1 to the interior of the GaN electron transit layer 3, between the source electrode 5 and the drain electrode 6. The side wall of the recess 7 is formed by the AlGaN electron supply layer 4 and the bottom surface is formed by the GaN electron transit layer 3. The first gate insulating film 8 is formed so as to cover the side wall and the bottom surface of the recess 7. The depth of the recess 7 is, for example, 50 nm from the surface of the AlGaN electron supply layer 4. The first gate insulating film 8 is formed of, for example, a silicon oxide film ($SiO_2$), and has a thickness of 50 nm. Instead of the silicon oxide film, a silicon nitride film (SiN), a silicon oxynitride film (SiNO), or alumina may be used.

The first gate electrode 9 is provided on the recess 7 via the first gate insulating film. The first gate electrode may be formed of, for example, polysilicon doped with an impurity. The first gate electrode is electrically connected to a not-shown gate terminal G. The source electrode 5 is connected to a not-shown source terminal S. The drain electrode 6 is connected to a not-shown drain terminal D.

As described above, the recess 7 is formed so as to penetrate through the AlGaN electron supply layer 4 and reach the interior of the GaN electron transit layer 3. The AlGaN electron supply layer 4 is not formed on a portion of the GaN electron transit layer 3 where the recess 7 is formed. Therefore, no two-dimensional electron gas is formed in a portion opposed by the first gate electrode 9 (a portion immediately below the first gate electrode 9) of the GaN electron transit layer 3.

The GaN electron transit layer 3 is a high resistance layer because it is formed by undoped crystal growth. That is, the portion opposed by the first gate electrode 9 of the GaN electron transit layer 3 is in the non-conduction state because a channel layer is lost in the direction from the source electrode 5 toward the drain electrode 6 (or its opposite direction) (in a direction parallel to the substrate 1). In the region where the recess 7 is not provided, the two-dimensional electron gas formed in the GaN electron transit layer 3 forms a channel layer through which a current flows. Therefore, the region is low resistive in a direction parallel to the substrate 1 and is in the conduction state.

Thus, as shown in the equivalent circuit of the HFET 100 according to the embodiment of FIG. 2, the HFET 100 includes therein a normally off FET 20 that includes the first gate electrode 9 and the first gate insulating film 8 as a gate, a portion of the AlGaN electron supply layer 4 adjacent to the recess 7 on the source electrode 5 side as a source, and a portion of the AlGaN electron supply layer 4 adjacent to the recess 7 on the drain electrode 6 side as a drain.

When a voltage lower than the threshold that is a positive voltage with respect to the source electrode 5 (a first voltage that is positive with respect to the source electrode) is applied to the first gate electrode 9, the normally off FET 20 is in the OFF state because there is no two-dimensional electron gas in a portion adjacent to the recess 7 of the GaN electron transit layer 3. When a voltage higher than the threshold mentioned above with respect to the source electrode 5 is applied to the first gate electrode 9, a two-dimensional electron gas due to a population inversion is formed in a portion of the GaN electron transit layer 3 adjacent to the first gate electrode 9 via the first gate insulating film 8. Consequently, the normally off FET 20 is switched to the ON state, and a current flows through the portion opposed to the first gate electrode 9 of the GaN electron transit layer 3 from the drain toward the source of the normally off FET 20.

In the embodiment, the threshold of the normally off FET 20 mentioned above is approximately 1 V, and is influenced by the material of the first gate insulating film, the thickness of the first gate insulating film, the composition of the first $In_{x1}Ga_{1-x1-y1}Al_{y1}N$ layer (in the embodiment, GaN) of the electron transit layer 3, and the like. The normally off FET 20 is designed using these parameters to obtain a desired threshold.

The interlayer insulating film 13 is provided so as to cover a region on the AlGaN electron supply layer 4 between the drain electrode 6 and the source electrode 5, and the first gate electrode. The source electrode 5 and the drain electrode 6 penetrate through the interlayer insulating film 13, and are electrically connected onto a surface of the AlGaN electron supply layer 4 on the opposite side to the substrate 1. The interlayer insulating film 13 insulates the first gate electrode 9 from the other electrodes. The interlayer insulating film 13 may be, for example, a silicon oxide film, or may be a silicon nitride film, a silicon oxynitride film, or a film of another insulator such as alumina. The interlayer insulating film 13 has a first opening that reaches the AlGaN electron supply layer 4 and exposes the AlGaN electron supply layer 4.

The Schottky electrode 10 is provided on the AlGaN electron supply layer 4 so as to be electrically connected to the AlGaN electron supply layer 4 via a Schottky junction in the first opening. That is, the Schottky electrode 10 penetrates through (or passes through) the interlayer insulating film 13 to be electrically connected to the AlGaN electron supply layer 4. The Schottky electrode 10 forms a Schottky junction with the AlGaN electron supply layer 4, or may form a Schottky junction with a nitride semiconductor layer further provided on the AlGaN electron supply layer 4.

The interlayer insulating film 13 has a second opening that reaches the second gate insulating film 11 provided on the AlGaN electron supply layer 4 in a direct contact manner. The second gate insulating film 11 is formed of, for example, a silicon nitride film, or may be a silicon oxide film, a silicon oxynitride film, or a film of another insulator such as alumina similarly to the first gate insulating film 8.

The second gate electrode 12 is provided in the second opening, that is, provided in the interlayer insulating film 13, and is adjacent to the AlGaN electron supply layer 4 via the second gate insulating film 11. The second gate electrode 12 penetrates through (or passes through) the interlayer insulating film 13 to reach the second gate insulating film 11. The second gate electrode 12 needs only to be an electric conductor. The second gate electrode 12 may be doped polysilicon similarly to the first gate electrode 9, or may be the same metal material as the source electrode 5 and the drain electrode 6 or another metal material.

In the embodiment, the second opening penetrates through the interlayer insulating film 13 and reaches the second gate insulating film 11, and the second gate electrode 12 is provided in the second opening. However, also a configuration is possible in which the interlayer insulating film 13 has a recess instead of the second opening and the bottom of the recess is adjacent to the second gate insulating film 11 via a portion of the interlayer insulating film 13. The second gate electrode 12 may be provided in the recess, that is, provided in the interlayer insulating film 13, and may be adjacent to the AlGaN electron supply layer 4 via the portion mentioned above of the interlayer insulating film 13 and the second gate insulating film 11. In this case, the threshold for the second gate electrode 12 that is a negative voltage described later is larger on the negative side than that in the case of FIG. 1 by an amount corresponding to the portion mentioned above of the interlayer insulating film 13.

The interconnection layer 14 is provided on the interlayer insulating film 13, on the source electrode 5, on the Schottky electrode 10, and on the second gate electrode 12, and electrically connects the source electrode 5, the Schottky electrode 10, and the second gate electrode 12. The interconnection layer 14 needs only to be an electrical conductor, and may be the same metal material as the source electrode or another metal material. As shown in FIG. 1, the interconnection layer 14 may be provided so as to extend from on the source electrode 5 through on the Schottky electrode 10 and on the second gate electrode 12 toward the drain electrode 6 and have a portion protruding from the second gate electrode 12 toward the drain electrode 6. In this case, the interconnection layer 14 functions as a field plate, and promotes the extension of a depletion layer from the second gate electrode 12 toward the drain electrode 6. The breakdown voltage between the second gate electrode 12 and the drain electrode 6 is improved.

When a positive voltage with respect to the drain electrode 6 is applied to the Schottky electrode 10, a current flows from the Schottky electrode 10 toward the AlGaN electron supply layer 4. That is, a Schottky barrier diode (SBD) 22 using the Schottky electrode as an anode and the AlGaN electron supply layer 4 as a cathode is formed in the HFET 100.

As shown in FIG. 2, the SBD 22 is a freewheel diode 22 electrically connected in antiparallel to the source-drain of the normally off FET 20. The Schottky electrode 10 of the SBD 22 is electrically connected to the source of the normally off FET 20 and is electrically connected to the source terminal S of the HFET 100. The cathode of the SBD is electrically connected to the drain of the normally off FET 20.

In a portion opposed to the second gate electrode 12 of the AlGaN electron supply layer 4, a recess 7 like that of the first gate electrode is not provided, and the thickness of the AlGaN electron supply layer 4 is the same thickness as the other portions. Therefore, a two-dimensional electron gas exists in a portion opposed to the second gate electrode of the GaN electron transit layer 3 similarly to the other portions. That is, in the portion opposed to the second gate electrode 12 of the GaN electron transit layer 3, a two-dimensional electron gas exists as a channel layer in the direction from the source electrode 5 toward the drain electrode 6 (or its opposite direction) (in a direction parallel to the substrate 1). Therefore, the portion is in the conduction state.

Thus, as shown in the equivalent circuit of the HFET 100 according to the embodiment of FIG. 2, the HFET 100 includes therein a normally on FET 21 that includes the second gate electrode 12 and the second gate insulating film 11 as a gate, a portion of the AlGaN electron supply layer 4 on the source electrode 5 side of the second gate electrode 12 as a source, and a portion of the AlGaN electron supply layer 4 on the drain electrode 6 side of the second gate electrode 12 as a drain.

In the normally on FET 21, when a voltage lower than the threshold that is a negative voltage (a second voltage that is negative with respect to the drain electrode 6) is applied to the second gate electrode 12, the two-dimensional electron gas that has existed in the portion opposed to the second gate electrode of the GaN electron transit layer 3 disappears due to the electric field from the second gate electrode. Consequently, the normally on FET 21 is switched to the OFF state.

When a voltage higher than the threshold mentioned above with respect to the drain electrode 6 is applied to the second gate electrode 12, the two-dimensional electron gas that has disappeared in the time of the OFF state comes to exist in the portion opposed to the second gate electrode of the GaN electron transit layer 3. Consequently, the normally on FET 21 is switched to the ON state, and a current flows through the portion opposed to the second gate electrode 12 of the GaN electron transit layer 3 from the drain toward the source of the normally on FET 21.

In the embodiment, the threshold of the normally on FET 21 mentioned above is approximately −8 V, and is influenced by the material of the second gate insulating film 11, the thickness of the second gate insulating film 11, the composition of the second $In_{x2}Ga_{1-x2-y2}Al_{y2}N$ layer that is the electron supply layer 4 (in the embodiment, AlGaN), and the like. The normally on FET 21 is designed using these parameters to have a desired threshold. In the embodiment, as an example, the second gate insulating film is a silicon nitride film with a thickness of 20 nm, and the electron supply layer is AlGaN with a thickness of 30 nm and an Al composition ratio of 25%.

The normally on FET 21 is cascode-connected to the normally off FET 20. That is, the gate of the normally on FET 21 is electrically connected to the source of the normally off FET 20 and is electrically connected to the source terminal S of the HFET 100. The source of the normally on FET 21 is electrically connected to the drain of the normally off FET 20. The drain of the normally on FET 21 is electrically connected to the drain terminal D of the HFET 100.

Figure 3:
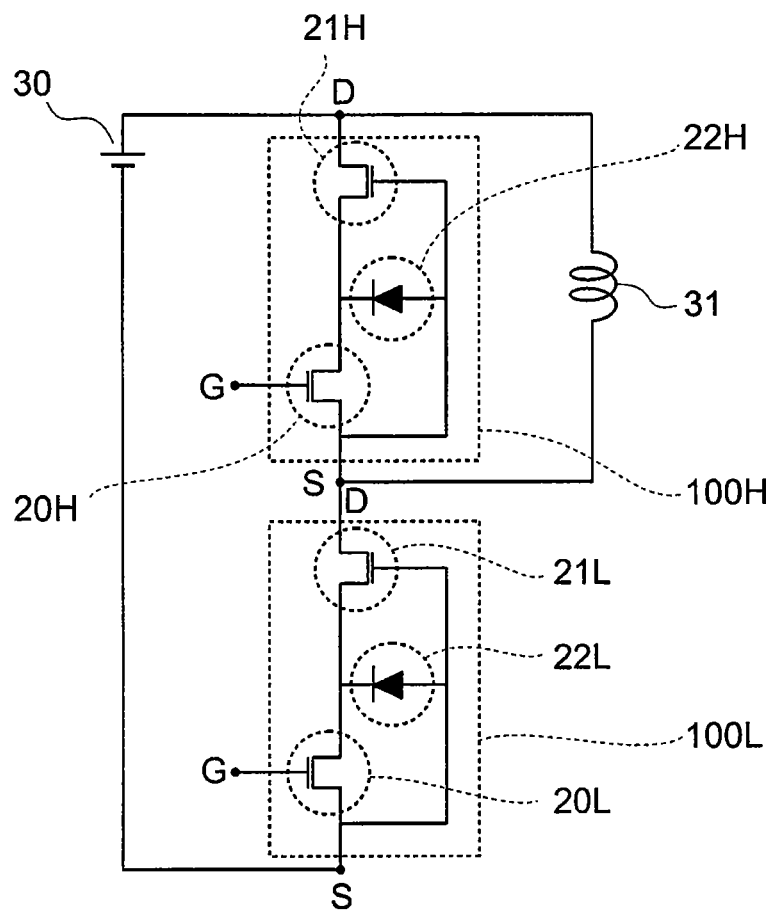
FIG. 3 is a circuit diagram of an example of a main portion of a switching circuit in which the nitride semiconductor device according the first embodiment is used.

Next, operations are described based on use examples of the HFET 100 according to the embodiment. The circuit shown in FIG. 3 is an example of a main portion of a switching circuit in which HFETs according to the embodiment are connected to a load including an inductance. The load including an inductance may be a motor and the like.

As shown in FIG. 3, the source terminal S of a high-side HFET 100H and the drain terminal D of a low-side HFET 100L are connected. Both the high-side HFET 100H and the low-side HFET 100L are the HFET 100 mentioned above according to the embodiment.

The positive electrode of a direct-current power source is connected to the drain terminal D of the high-side HFET 100H. The negative electrode of the direct-current power source is connected to the source terminal S of the low-side HFET 100L. One end of an inductance 31 is connected to the drain terminal D of the high-side HFET 100H, and the other end is connected to the source terminal S of the high-side HFET 100H. A description is given on the assumption that the source terminal S of the low-side HFET 100L is grounded (not shown). Operations in states will now be described.

State 1

First, a voltage lower than the threshold of a normally off FET 20L is applied to the gate terminal G of the low-side HFET 100L, and the normally off FET 20L is in the OFF state. Similarly, a voltage lower than the threshold of a normally off FET 20H is applied to the gate terminal G of the high-side HFET 100H, and the normally off FET 20H is in the OFF state.

The drain terminal D and the source terminal S of the high-side HFET 100H become the same potential as the voltage of the direct-current power source 30 due to the inductor 31. That is, the gate and the drain of a normally on FET 21H in the high-side HFET 100H become the same potential, and the normally on FET 21H is switched to the ON state.

In regard to a normally on FET 21L in the low-side HFET 100L, the drain becomes the same potential as the voltage of the direct-current power source 30, and the gate becomes the ground potential via the source terminal S of the low-side HFET 100L. Therefore, the normally on FET 21L is in the OFF state because its gate potential is lower than its source potential by an amount of the voltage of the direct-current power source 30. Consequently, the low-side HFET 100L is in the OFF state.

State 2

Next, a voltage not less than the threshold of the normally off FET 20L is applied to the gate terminal G of the low-side HFET 100L to switch the normally off FET 20L to the ON state. Since the gate and the source of the normally on FET 21L become the same potential, the normally on FET 21L is switched from the OFF state to the ON state. Therefore, the low-side FET 100L is switched to the ON state, and the current from the inductor 31 flows from the drain terminal D of the low-side FET 100L toward the source terminal S. Consequently, the electric potential of the source terminal S of the high-side HFET 100H decreases toward the ground potential. In the course of this, when the gate potential of the normally on FET 21H in the high-side HFET 100H decreases to the threshold or less, the normally on FET 21H is switched to the OFF state.

At this time, the voltage of the direct-current power source 30 is applied between the drain terminal D and the source terminal S of the high-side HFET 100H. The voltage of the direct-current power source 30 is applied to the normally off FET 20H via the normally on FET 21H. That is, the voltage of the direct-current power source 30 is shared by the normally on FET 21H.

As can be seen from the cross section of FIG. 1, the source-drain voltage of the HFET 100 is mostly determined by a portion of the GaN electron transit layer 3 between the Schottky electrode 10 and the drain electrode 6. That is, the source-drain voltage of the HFET 100 is mostly applied to the normally on FET 21. Therefore, the breakdown voltage between the source terminal S and the drain terminal D of the high-side HFET 100H is determined by the breakdown voltage of the normally on FET 21H. This applies also to the low-side HFET 100L.

State 3

Next, a voltage not more than the threshold of the normally off FET 20L is applied to the gate terminal G of the low-side HFET 100L to switch the normally off FET 20L to the OFF state. Thus, when the electric potential of the gate of the normally on FET 21L decreases with respect to the electric potential of the drain and the source and becomes the threshold or less, the normally on FET 21L is switched to the OFF state. Consequently, the low-side FET 100L is switched to the OFF state, and the voltage of the direct-current power source 30 is applied between the source terminal S and the drain terminal D of the low-side FET 100L.

As a consequence, the electric potential of the source terminal S of the high-side HFET 100H increases to a voltage higher than the power supply voltage by an amount of the electromotive force for maintaining the current that has been flowing through the inductor 31. Consequently, the electric potential of the gate of the normally on FET 21H in the high-side HFET 100H becomes higher than the electric potential of the drain, and the normally on FET 21H is switched to the ON state.

When the normally on FET 21H is switched to the ON state, an SBD 22H in the high-side HFET 100H is simultaneously switched to the ON state. The SBD 22H acts as a freewheel diode to circulate the current that has been flowing through the inductor 31. This state is the same state as state 1 mentioned above.

By repeating the application of a voltage not less than the threshold to the gate terminal G of the low-side HFET 100L, state 2 and state 3 mentioned above can be repeated.

From the above, the features of the operations of the HFET 100 according to the embodiment are summarized as follows. In a state where a voltage lower than the threshold of the normally off FET 20 is applied to the gate terminal G of the HFET 100 according to the embodiment, since the normally off FET 20 is in the OFF state, the HFET 100 is in the OFF state. That is, the HFET 100 according to the embodiment is a normally off FET.

In the time of the initial state or at a time immediately before which the normally off FET 20 was in the ON state, since the source and the gate of the normally on FET 21 are the same potential, the normally on FET 21 is in the ON state. Therefore, the drain and the source of the normally on FET 21 are almost the same potential. In this state, when a voltage is applied so that the electric potential of the drain terminal D of the HFET 100 may become higher than that of the source terminal S, the electric potential of the gate of the normally on FET 21 becomes lower than those of the drain and the source by an amount of the applied voltage. Consequently, when the voltage applied to the drain terminal D is larger than the absolute value of the threshold of the normally on FET 21, the normally on FET 21 is switched to the OFF state, and thereby the voltage applied between the source terminal S and the drain terminal D of the HFET 100 is applied to the normally off FET 20 and the SBD 22 via the normally on FET 21.

As a consequence, most of the voltage between the source terminal S and the drain terminal D of the HFET 100 is shared by the normally on FET 21. Therefore, since the breakdown voltage of the normally on FET 21 can be regarded as the breakdown voltage between the source terminal S and the drain terminal D of the HFET 100, it is not necessary to increase the breakdown voltages of the normally off FET 20 and the SBD 22. Several tens of volts are sufficient for the breakdown voltages of the normally off FET 20 and the SBD 22.

In contrast, it is desired for the breakdown voltage of the normally on FET 21 to be high. The breakdown voltage of the normally on FET 21 increases as the distance between the second gate electrode 12 and the drain electrode 6 increases, and the distance is preferably set to approximately 6 μm in order to obtain a breakdown voltage of 600 V.

When a voltage higher than the threshold of the normally off FET 20 is applied to the gate terminal G of the HFET 100, the normally off FET 20 is switched to the ON state. Since the gate of the normally on FET 21 becomes the same potential as the source, also the normally on FET 21 is switched to the ON state. Consequently, the HFET 100 is switched to the ON state.

In the time when the HFET 100 is in the OFF state mentioned above, when the electric potential of the source terminal S of the HFET 100 becomes higher than that of the drain terminal D to cause a circulating current to flow, the SBD 22 is switched to the ON state. Also the normally on FET 21 is switched to the ON state because the source and the gate thereof become the same potential. Thus, the SBD 22 operates as a freewheel diode.

In the above way, the HFET 100 according to the embodiment operates as an FET including the gate terminal G, the source terminal S, and the drain terminal D, and at the same time the SBD 22 included operates as a freewheel diode. As described above, since the SBD 22 may have a low breakdown voltage, it is not necessary to raise the Schottky barrier to increase the breakdown voltage. That is, since a design can be made with the Schottky barrier set low, the forward voltage at the time of the ON state can be designed to be low. For example, a Schottky electrode with a small work function can be selected. Since the forward voltage of the SBD 22 is decreased, the power loss due to the SBD 22 can be reduced.

When the HFET 100 is in the ON state, a current flows through the normally off FET 20 and the normally on FET 21 in series. The sum of the ON resistances of both is the ON resistance of the HFET 100. The ON resistance of the normally on FET 21 is sufficiently low, but the ON resistance of the normally off FET 20 is higher than that. This is because in the normally off FET 20, a processing such as forming the recess 7 is performed in a portion opposed to the gate electrode 9 of the AlGaN electron supply layer 4 and a defect is thereby caused between the gate electrode 9 and the GaN electron transit layer 3. Since the defect increases the resistance of a portion opposed to the gate electrode 9 of the GaN electron transit layer 3, the normally off FET 20 has a high ON resistance.

The ON resistance can be reduced by shortening the length of the gate electrode in the direction from the source toward the drain. However, if the length of the gate electrode 9 is shortened, the short channel effect is caused in which, in spite of being in the OFF state, a channel layer is formed in a portion opposed by the gate electrode 9 of the GaN electron transit layer 3 so that the normally off FET 20 is switched to the ON state even when the source-drain voltage is low. Hence, there has been a problem that reducing the ON resistance of the normally off FET leads to a decreased breakdown voltage thereof.

As described above, the breakdown voltage of the HFET 100 according to the embodiment does not decrease even when the breakdown voltage of the normally off FET 20 is reduced. Thus, the HFET 100 according to the embodiment can include a normally off FET 20 with a shortened length of the gate electrode in the source-drain direction, and can therefore have a low ON resistance while maintaining a high breakdown voltage.

For example, in the case where the normally off FET 20 has a breakdown voltage of 600 V, it is necessary for the gate electrode to have a length of approximately 1 μm. In the HFET 100 according to the embodiment, since the breakdown voltage of the normally off FET 20 may be, for example, approximately 20 V, the gate length may be as short as approximately 0.6 μm. The ON resistance of the normally off FET 20 can be reduced to approximately half of that in the case where the breakdown voltage is 600 V.

Thus, the embodiment provides a normally off nitride semiconductor device having a high breakdown voltage and a low ON resistance and including a freewheel diode with a low forward voltage.

In the embodiment, the first gate electrode 9 of the normally off FET 20 is provided on the recess 7 penetrating through the AlGaN electron supply layer 4 and reaching the GaN electron transit layer 3 via the first gate insulating film 8. However, as described in the next embodiment, also a structure is possible in which the recess does not reach the GaN electron transit layer 3, that is, the bottom of the recess is located in the AlGaN electron supply layer 4, and the first gate electrode is provided on the recess via the first gate insulating film.

Alternatively, the first gate electrode 9 may be provided on the AlGaN electron supply layer 4 via a p-type nitride semiconductor layer expressed by the formula of $In_xGa_{1-x-y}Al_yN$. In this case, a depletion layer extends from the p-n junction interface between the p-type nitride semiconductor layer and the AlGaN electron supply layer 4 and the two-dimensional electron gas disappears; thereby, a normally off FET is formed.

The normally off FET 20 according to the embodiment is not limited to the configuration described above, but any structure that performs a normally off operation can be used for the embodiment.

Second Embodiment

Figure 4:
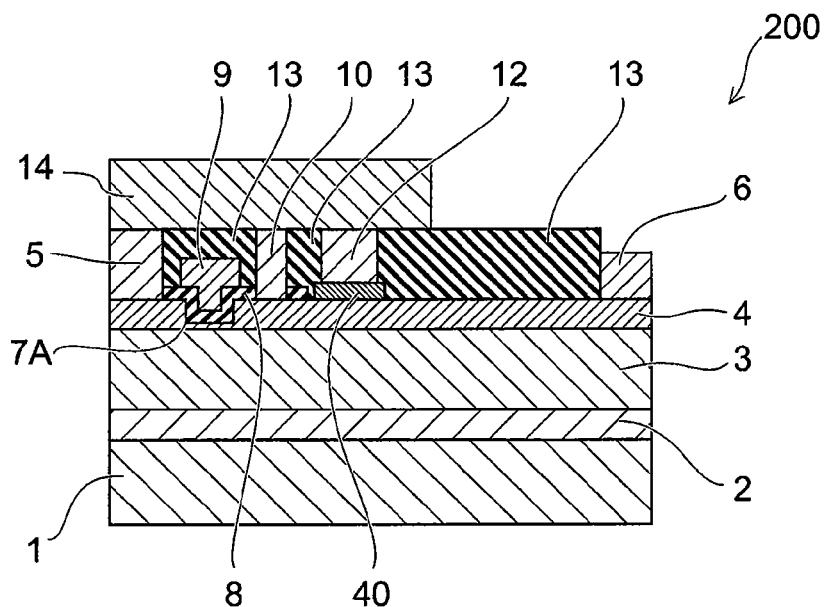
FIG. 4 is a schematic cross-sectional view of a main portion of a nitride semiconductor device according to a second embodiment.
Figure 5:
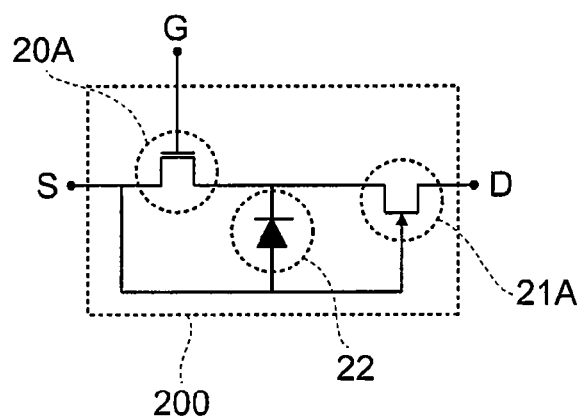
FIG. 5 is an equivalent circuit diagram of the nitride semiconductor device according to the second embodiment.

A nitride semiconductor device according to a second embodiment will now be described using FIG. 4 and FIG. 5. FIG. 4 is a schematic cross-sectional view of a main portion of an HFET 200 according to the embodiment. FIG. 5 is an equivalent circuit diagram of the HFET 200 according to the embodiment. Portions having a configuration identical to the configuration described in the first embodiment are marked with the same reference numerals or symbols, and a description thereof is omitted. Differences from the first embodiment are mainly described.

In the HFET 200 according to the embodiment, a recess 7A is formed from a surface of the AlGaN electron supply layer 4 on the opposite side to the substrate 1 to the interior of the AlGaN electron supply layer 4. That is, the bottom of the recess 7A does not reach the GaN electron transit layer 3 but is located in the AlGaN electron supply layer 4. Both the side wall and the bottom of the recess 7A are formed of the AlGaN electron supply layer 4. The first gate electrode 9 is provided on the recess 7A via the first gate insulating film 8.

The HFET 200 according to the embodiment differs from the HFET 100 according to the first embodiment in that the AlGaN electron supply layer 4 is provided between the first gate insulating film 8 and the GaN electron transit layer 3. A portion between the first gate insulating film 8 and the GaN electron transit layer 3 (a portion adjacent to the bottom of the recess 7A) of the AlGaN electron supply layer 4 has a sufficiently thinner film thickness in the stacking direction than the other portions of the AlGaN electron supply layer 4. Consequently, a two-dimensional electron gas caused by the piezoelectric effect and spontaneous polarization is hardly generated in a portion opposed to the first gate electrode 9 of the GaN electron transit layer 3.

In the embodiment, as an example, the AlGaN electron supply layer 4 has an Al composition ratio of 30% and a thickness of 15 nm, the first gate insulating film has a thickness of 20 nm, and the depth of the recess 7 from the surface of the AlGaN electron supply layer 4 on the opposite side to the substrate 1 is 12 nm.

Similarly to the HFET 100 according to the first embodiment, as shown in the equivalent circuit of FIG. 5, the HFET 200 according to the embodiment includes therein a normally off FET 20A that includes the first gate electrode 9 and the first gate insulating film 8 as a gate, a portion of the AlGaN electron supply layer 4 adjacent to the recess 7A on the source electrode 5 side as a source, and a portion of the AlGaN electron supply layer 4 adjacent to the recess 7A on the drain electrode 6 side as a drain.

In addition, the HFET 200 according to the embodiment differs from the HFET 100 according to the first embodiment in the following respects. Otherwise, both are the same structure.

The HFET 200 according to the embodiment includes a p-type GaN layer 40 instead of the second gate insulating film 11 of the HFET 100 according to the first embodiment. That is, the second gate electrode 12 is formed on the AlGaN electron supply layer 4 via a nitride semiconductor layer 40 (a third $In_{x3}Ga_{1-x3-y3}Al_{y3}N$ layer) expressed by p-type $In_{x3}Ga_{1-x3-y3}Al_{y3}N$ ($0 \leq x3 \leq 1$, $0 \leq y3 \leq 1$). The p-type $In_{x3}Ga_{1-x3-y3}Al_{y3}N$ layer is, for example, a GaN layer 40.

In a portion opposed to the second gate electrode 12 of the AlGaN electron supply layer 4, a recess 7A like that of the first gate electrode is not provided, and the thickness of the AlGaN electron supply layer 4 is the same thickness as the other portions. Therefore, a two-dimensional electron gas exists in a portion opposed to the second gate electrode 12 of the GaN electron transit layer 3 similarly to the other portions. That is, the portion opposed to the second gate electrode 12 of the GaN electron transit layer 3 is in the conduction state because a two-dimensional electron gas exists as a channel layer in the direction from the source electrode 5 toward the drain electrode 6 (or its opposite direction) (in a direction parallel to the substrate 1).

Thus, as shown in the equivalent circuit of FIG. 5, the HFET 200 includes therein a normally on FET 21A that includes the second gate electrode 12 and the p-type GaN layer 40 as a gate, a portion of the AlGaN electron supply layer 4 on the source electrode 5 side of the second gate electrode 12 as a source, and a portion of the AlGaN electron supply layer 4 on the drain electrode 6 side of the second gate electrode 12 as a drain. The normally on FET 21A is a junction FET that controls the current between source and drain by applying a reverse bias to the p-n junction between the p-type GaN layer 40 and the AlGaN electron supply layer 4 to extend a depletion layer.

In the normally on FET 21A, when a voltage lower than the threshold that is a negative voltage (the second voltage that is negative with respect to the drain electrode 6) is applied to the second gate electrode 12, the two-dimensional electron gas that has existed in the portion opposed to the second gate electrode 12 of the GaN electron transit layer 3 disappears due to the depletion layer extending from the interface between the p-type GaN 40 and the AlGaN electron supply layer 4. Consequently, the normally on FET 21A is switched to the OFF state.

When a voltage higher than the threshold mentioned above with respect to the drain electrode 6 is applied to the second gate electrode 12, the two-dimensional electron gas that has disappeared at the time of the OFF state comes to exist in the portion opposed to the second gate electrode 12 of the GaN electron transit layer 3. Consequently, the normally on FET 21A is switched to the ON state, and a current flows through the portion opposed to the second gate electrode 12 of the GaN electron transit layer 3 from the drain toward the source of the normally on FET 21A.

In the embodiment, the threshold of the normally on FET 21A mentioned above is approximately −4 V, and is influenced by the composition of the p-type third $In_{x3}Ga_{1-x3-y3}Al_{y3}N$ layer 40 (in the embodiment, GaN), the thickness of the p-type third $In_{x3}Ga_{1-x3-y3}Al_{y3}N$ layer 40, the p-type impurity concentration of the p-type third $In_{x3}Ga_{1-x3-y3}Al_{y3}N$ layer 40, the composition of the second $In_{x2}Ga_{1-x2-y2}Al_{y2}N$ layer 4 of the electron supply layer 4 (in the embodiment, AlGaN), the thickness of the second $In_{x2}Ga_{1-x2-y2}Al_{y2}N$ layer 4 of the electron supply layer 4, and the like. The normally on FET 21A is designed using these parameters to obtain a desired threshold.

In the embodiment, as an example, the third $In_{x3}Ga_{1-x3-y3}Al_{y3}N$ layer 40 is GaN, and the thickness and p-type impurity concentration thereof are 50 nm and $1 \times 10^{18}/cm^3$, respectively. The electron supply layer 4 is AlGaN with a thickness of 30 nm and an Al composition ratio of 25%. The breakdown voltage of the normally on FET 21A is determined by the distance between the second gate electrode 12 and the drain electrode 6 similarly to the normally on FET 21 according to the first embodiment.

The HFET 200 according to the embodiment has almost similar operations and features to the HFET 100 according to the first embodiment. Since the breakdown voltage of the HFET 200 according to the embodiment is determined by the breakdown voltage of the normally on FET 21A similarly to the HFET 100 according to the first embodiment, the breakdown voltage of the normally off FET 20A and the SBD 22 included can be reduced. Therefore, the forward voltage of the SBD 22 included can be reduced, and the resistance of the normally off FET 20A can be reduced. A normally off nitride semiconductor device having a high breakdown voltage and a low ON resistance and including a freewheel diode with a low forward voltage is provided.

Since the second gate electrode 12 is provided on the AlGaN electron supply layer 4 via the p-type GaN layer 40, the HFET 200 according to the embodiment includes a p-n diode composed of the p-type GaN layer 40 and the AlGaN electron supply layer 4 between the second gate electrode 12 and the GaN electron transit layer 3. The p-n diode has an ON voltage of 3 V or more. Therefore, since the SBD 22 has a lower ON voltage, the p-n diode is not switched to the ON state earlier than the SBD 22 even if a large positive voltage is applied to the source terminal S of the HFET 200. The circulating current flows only through the SBD 22.

When a voltage exceeding the breakdown voltage is applied between the source terminal S and the drain terminal D of the HFET 200, avalanche breakdown occurs near the p-n junction between the p-type GaN layer 40 and the AlGaN electron supply layer 4 in the vicinity of the second gate electrode 12. Holes generated by the avalanche breakdown can be discharged from the second gate electrode 12 to the source terminal S of the HFET 200 via the p-type GaN layer 40. Thus, the HFET 200 according to the embodiment further has the feature of a high avalanche withstand capability as compared to the HFET 100 according to the first embodiment.

In the HFET 200 according to the embodiment, the first gate electrode 9 of the normally off FET 20A is provided on the recess 7A of which the bottom does not reach the GaN electron supply layer 3 but is located in the AlGaN electron supply layer 4, via the first gate insulating film 8. However, similarly to the first embodiment, the first gate electrode 9 of the normally off FET 20A may be provided on the recess 7 penetrating through the AlGaN electron supply layer 4 and reaching the GaN electron supply layer 3, via the first gate insulating film 8.

Alternatively, similarly to the second gate electrode 12 of the embodiment, the first gate electrode 9 may be provided on the AlGaN electron supply layer 4 via a p-type nitride semiconductor layer expressed by the formula of $In_xGa_{1-x-y}Al_yN$. In this case, a depletion layer extends from the p-n junction interface between the p-type nitride semiconductor layer and the AlGaN electron supply layer 4 and the two-dimensional electron gas disappears; thereby, a normally off FET is formed.

Third Embodiment

Figure 6:
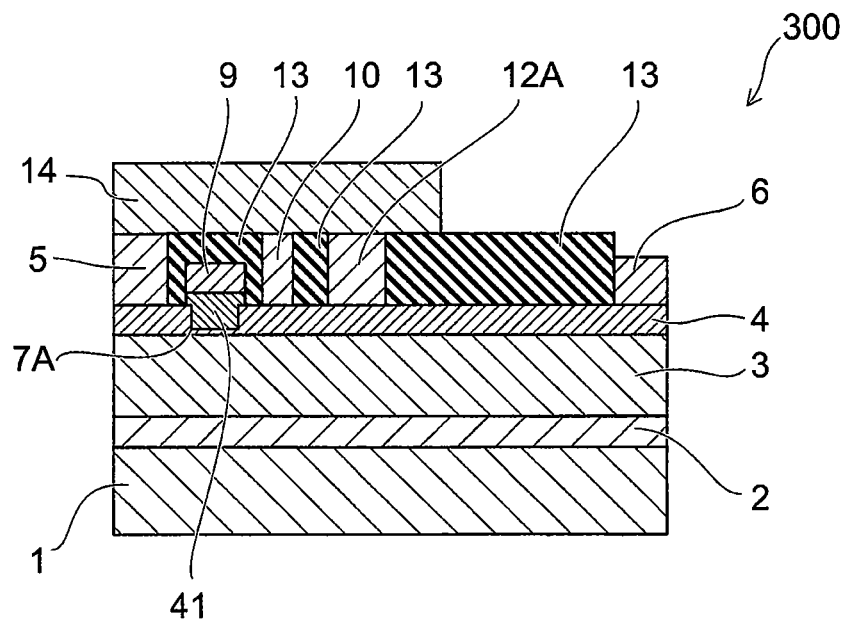
FIG. 6 is a schematic cross-sectional view of a main portion of a nitride semiconductor device according to a third embodiment.
Figure 7:
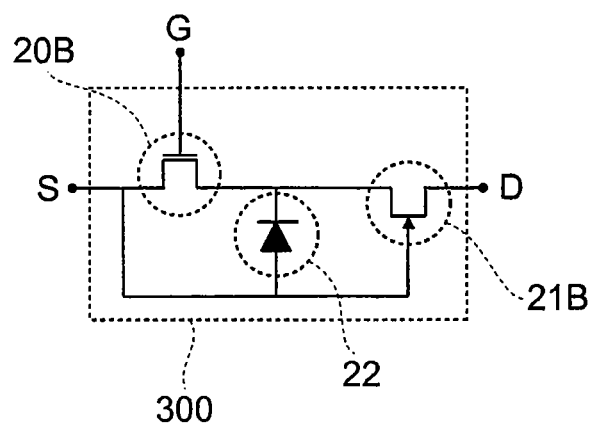
FIG. 7 is an equivalent circuit diagram of the nitride semiconductor device according to the third embodiment.

A semiconductor device according to a third embodiment will now be described using FIG. 6 and FIG. 7. FIG. 6 is a schematic cross-sectional view of a main portion of an HFET 300 according to the embodiment. FIG. 7 is an equivalent circuit diagram of the HFET 300 according to the embodiment. Portions having a configuration identical to the configuration described in the second embodiment are marked with the same reference numerals or symbols, and a description thereof is omitted. Differences from the second embodiment are mainly described.

In the HFET 300 according to the embodiment, the recess 7A is formed from a surface of the AlGaN electron supply layer 4 on the opposite side to the substrate 1 to the interior of the AlGaN electron supply layer 4 similarly to the HFET 200 according to the second embodiment. The HFET 300 according to the embodiment differs from the HFET 200 according to the second embodiment in that the first gate electrode 9 is provided on the recess 7A via a nitride semiconductor layer 41 of the p type conductivity (a p-type nitride semiconductor layer) instead of the first gate insulating film 8. The p-type nitride semiconductor layer 41 is expressed by $In_xGa_{1-x-y}Al_yN$ ($0 \le x \le 1$, $0 \le y \le 1$). In the embodiment, as an example, a p-type GaN layer 41 is used as the p-type nitride semiconductor layer 41.

The HFET 300 according to the embodiment includes a normally off FET 20B including the first gate electrode 9 because a two-dimensional electron gas caused by the piezoelectric effect and spontaneous polarization is hardly generated in a portion opposed to the first gate electrode 9 of the GaN electron transit layer 3, similarly to the HFET 200 according to the second embodiment. Since the p-type GaN layer 41 is used in place of the first gate insulating film 8, the HFET 300 according to the embodiment has a high threshold on the positive voltage side as compared to the HFET 200 according to the second embodiment. This is because the two-dimensional electron gas in the portion opposed to the first gate electrode 9 of the GaN electron transit layer 3 disappears easily due to the depletion layer at the p-n junction between the p-type GaN layer 41 and the AlGaN electron supply layer 4.

Similarly to the HFET 200 according to the second embodiment, as shown in the equivalent circuit of FIG. 7, the HFET 300 according to the embodiment includes therein the normally off FET 20B that includes the first gate electrode 9 and the p-type GaN layer 41 as a gate, a portion of the AlGaN electron supply layer 4 adjacent to the recess 7 on the source electrode 5 side as a source, and a portion of the AlGaN electron supply layer 4 adjacent to the recess 7 on the drain electrode 6 side as a drain.

In addition, the HFET 300 according to the embodiment differs from the HFET 200 according to the second embodiment in the following respects. Otherwise, both are the same structure.

The HFET 300 according to the embodiment does not include the p-type GaN layer 40 included in the HFET 200 according to the second embodiment. A second gate electrode 12A is a Schottky electrode, and forms a Schottky junction with the AlGaN electron supply layer 4.

Alternatively, the second gate electrode 12A may form a Schottky junction with a nitride semiconductor layer further provided on the AlGaN electron supply layer 4. That is, the second gate electrode is provided on the AlGaN electron supply layer 4 via a Schottky junction.

Here, since it is necessary to make the forward voltage of the SBD including the schottky electrode 12A higher than that of the SBD 22 including the Schottky electrode 10, the second gate electrode 12A is formed of a metal having a larger work function than the Schottky electrode 10.

Also in the HFET 300 according to the embodiment, similarly to the HFET 200 according to the second embodiment, a two-dimensional electron gas exists in a portion opposed to the second gate electrode 12A of the GaN electron transit layer 3 like the other portions. That is, the portion opposed to the second gate electrode 12A of the GaN electron transit layer 3 is in the conduction state because a two-dimensional electron gas exists as a channel layer in the direction from the source electrode 5 toward the drain electrode 6 (or its opposite direction) (in a direction parallel to the substrate 1).

Thus, as shown in the equivalent circuit of FIG. 7, the HFET 300 includes therein a normally on FET 21B that includes the second gate electrode 12A as a gate, a portion of the AlGaN electron supply layer 4 on the source electrode 5 side of the second gate electrode 12A as a source, and a portion of the AlGaN electron supply layer 4 on the drain electrode 6 side of the second gate electrode 12A as a drain. The normally on FET 21B is a MESFET (metal semiconductor field effect transistor) that controls the current between source and drain by applying a reverse bias to the Schottky junction between the second gate electrode 12A and the AlGaN electron supply layer 4 to extend a depletion layer.

The HFET 300 according to the embodiment has almost similar operations and features to the HFET 200 according to the second embodiment. Since the breakdown voltage of the HFET 300 according to the embodiment is determined by the breakdown voltage of the normally on FET 21B similarly to the HFET 200 according to the second embodiment, the breakdown voltages of the normally off FET 20B and the SBD 22 included can be reduced. Therefore, the forward voltage of the SBD 22 included can be reduced, and the resistance of the normally off FET 20B can be reduced. A normally off nitride semiconductor device having a high breakdown voltage and a low ON resistance and including a freewheel diode with a low forward voltage is provided.

Since the second gate electrode is provided on the AlGaN electron supply layer 4 via a Schottky junction, the HFET 300 according to the embodiment cannot discharge holes generated by avalanche breakdown. Consequently, the HFET 300 has a reduced avalanche withstand capability as compared to the HFET 200 according to the second embodiment.

In the embodiments described above, to further reduce the ON resistance of the HFET, it is also possible to use a spacer layer of AlN or the like between the AlGaN electron supply layer 4 and the GaN electron transit layer 3. The spacer layer suppresses diffusion of an n-type impurity from the AlGaN electron supply layer 4 to the GaN electron transit layer 3, and can suppress a reduction in the mobility of the two-dimensional electron gas in the GaN electron transit layer 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride semiconductor device comprising:
    a substrate;
    a first $In_{x1}Ga_{1-x1-y1}Al_{y1}N$ ($0 \leq x1 \leq 1$, $0 \leq y1 \leq 1$) layer provided on the substrate;
    a second $In_{x2}Ga_{1-x2-y2}Al_{y2}N$ ($0 \leq x2 \leq 1$, $0 \leq y2 \leq 1$) layer provided on a surface of the first $In_{x1}Ga_{1-x1-y1}Al_{y1}N$ layer and configured to form a two-dimensional electron gas at an interface with the first $In_{x1}Ga_{1-x1-y1}Al_{y1}N$ layer, the second $In_{x2}Ga_{1-x2-y2}Al_{y2}N$ layer having a wider band gap than the first $In_{x1}Ga_{1-x1-y1}Al_{y1}N$ layer, the second $In_{x2}Ga_{1-x2-y2}Al_{y2}N$ layer including first region and a second region spaced apart from the first region in a first direction;
    an interlayer insulating film provided on a surface of the second $In_{x2}Ga_{1-x2-y2}Al_{y2}N$ layer that is on a side opposite the first $In_{x1}Ga_{1-x1-y1}Al_{y1}N$ layer;
    a source electrode provided on the first region;
    a drain electrode provided on the second region and spaced apart from the source electrode in the first direction;
    a first gate electrode, a first part of the first gate electrode being provided between the source electrode and the drain electrode, a second part of the first gate electrode being provided between the first region and the second region;
    a first gate insulating film having at least a first portion that is between the first gate electrode and the second $In_{x2}Ga_{1-x2-y2}Al_{y2}N$ layer;
    a second gate electrode provided on the second region and between the first gate electrode and the drain electrode, the second gate electrode being electrically connected to the source electrode;
    a Schottky electrode provided between the first gate electrode and the second gate electrode and connected via a Schottky junction to the second $In_{x2}Ga_{1-x2-y2}Al_{y2}N$ layer, the Schottky electrode electrically connected to the second gate electrode, the interlayer insulating film being provided between the second gate electrode and the Schottky electrode, between the source electrode and the first gate electrode, between the first gate electrode and the Schottky electrode, and between the second gate electrode and the drain electrode, and
    the first gate electrode being electrically isolated from the source electrode, the drain electrode, the second gate electrode, and the Schottky electrode.

2. The device according to claim 1, wherein a p-type nitride semiconductor layer is further provided between the first gate electrode and the second $In_{x2}Ga_{1-x2-y2}Al_{y2}N$ layer, and the first gate electrode, the p-type nitride semiconductor layer, and the second $In_{x2}Ga_{1-x2-y2}Al_{y2}N$ layer are electrically connected.

3. The device according to claim 2, wherein the p-type nitride semiconductor layer is formed between the first gate electrode and the second $In_{x2}Ga_{1-x2-y2}Al_{y2}N$ layer and a bottom surface of the p-type nitride semiconductor layer is at a same level as the second $In_{x2}Ga_{1-x2-y2}Al_{y2}N$ layer.

4. The device according to claim 1, further comprising:
    a p-type third $In_{x3}Ga_{1-x3-y3}Al_{y3}N$ ($0 \leq x3 \leq 1$, $0 \leq y3 \leq 1$) layer provided between the second $In_{x2}Ga_{1-x2-y2}Al_{y2}N$ layer and the second gate electrode.

5. The device according to claim 4, wherein the p-type third $In_{x3}Ga_{1-x3-y3}Al_{y3}N$ layer is provided between the first gate electrode and the second $In_{x2}Ga_{1-x2-y2}Al_{y2}N$ layer, and the first gate electrode, the p-type third $In_{x3}Ga_{1-x3-y3}Al_{y3}N$ layer, and the second $In_{x2}Ga_{1-x2-y2}Al_{y2}N$ layer are electrically connected.

6. The device according to claim 4, wherein the p-type third $In_{x3}Ga_{1-x3-y3}Al_{y3}N$ layer is formed between the first gate electrode and the second $In_{x2}Ga_{1-x2-y2}Al_{y2}N$ layer and a bottom surface of the p-type third $In_{x3}Ga_{1-x3-y3}Al_{y3}N$ is at a level that is the same as a level of the second $In_{x2}Ga_{1-x2-y2}Al_{y2}N$ layer.

7. The device according to claim 1, wherein the second gate electrode forms a Schottky junction with the second $In_{x2}Ga_{1-x2-y2}Al_{y2}N$ layer and includes a metal having a work function that is larger than a work function of the Schottky electrode.

8. The device according to claim 7, wherein a p-type third $In_{x3}Ga_{1-x3-y3}Al_{y3}N$ layer is provided between the first gate electrode and the second $In_{x2}Ga_{1-x2-y2}Al_{y2}N$ layer, and the first gate electrode, the p-type third $In_{x3}Ga_{1-x3-y3}Al_{y3}N$ layer, and the second $In_{x2}Ga_{1-x2-y2}Al_{y2}N$ layer are electrically connected.

9. The device according to claim 7, wherein a p-type third $In_{x3}Ga_{1-x3-y3}Al_{y3}N$ layer is formed between the first gate electrode and the second $In_{x2}Ga_{1-x2-y2}Al_{y2}N$ layer and a bottom surface of the p-type third $In_{x3}Ga_{1-x3-y3}Al_{y3}N$ layer is at a level that is the same as a level of the second $In_{x2}Ga_{1-x2-y2}Al_{y2}N$ layer.

10. The device according to claim 1, wherein the first $In_{x1}Ga_{1-x1-y1}Al_{y1}N$ layer includes a third region and a fourth region,
the third region overlaps the first region in a second direction that is substantially orthogonal to the surface of the first $In_{x1}Ga_{1-x1-y1}Al_{y1}N$ layer and perpendicular to the first direction,
the fourth region overlaps the second region in the second direction,
a third part of the first gate electrode is between the third region and the fourth region in the first direction, and
a second portion of the first gate insulating film is between the first gate electrode and the first $In_{x2}Ga_{1-x2-y2}Al_{y2}N$ layer.

11. The device according to claim 1 further comprising;
a second gate insulating film provided between the second $In_{x2}Ga_{1-x2-y2}Al_{y2}N$ layer and the second gate electrode.

12. The device according to claim 11, wherein a first portion of the drain electrode directly contacts the second $In_{x2}Ga_{1-x2-y2}Al_{y2}N$ layer and a second portion of the drain electrode directly contacts the second gate insulating film.

13. The device according to claim 11, wherein the Schottky electrode contacts the second gate insulating film.

14. The device according to claim 11, wherein the second gate insulating film is between a portion of the drain electrode and a portion of the Schottky electrode in the first direction.

15. The device according to claim 1 further comprising,
an interconnection layer provided on the interlayer insulating film and directly contacting the source electrode, the Schottky electrode, the second gate electrode,
wherein the source electrode, the Schottky electrode, the second gate electrode, and at least some part of the interlayer insulating film is between the second $In_{x2}Ga_{1-x2-y2}Al_{y2}N$ layer and the interconnection layer.

16. The device according to claim 15, wherein the interconnection layer includes a protruding portion and the protruding portion extends in the first direction from the second gate electrode and does not reach the drain electrode.

17. The device according to claim 1, wherein an upper surface of the first gate electrode is lower than an upper surface of the second gate electrode.

18. The device according to claim 1, wherein an upper surface of the drain electrode is lower than an upper surface of the source electrode.

19. The device according to claim 4, wherein the p-type third $In_{x3}Ga_{1-x3-y3}Al_{y3}N$ layer is between the Schottky electrode and the drain electrode in the first direction.

20. The device according to claim 4, wherein an upper surface of the first gate electrode is lower than an upper surface of the p-type third $In_{x3}Ga_{1-x3-y3}Al_{y3}N$ layer.

* * * * *